United States Patent
Jain et al.

(10) Patent No.: US 9,496,250 B2
(45) Date of Patent: Nov. 15, 2016

(54) TUNABLE SCALING OF CURRENT GAIN IN BIPOLAR JUNCTION TRANSISTORS

(71) Applicant: GLOBALFOUNDRIES INC., Grand Cayman (KY)

(72) Inventors: Vibhor Jain, Essex Junction, VT (US); Alvin J. Joseph, Williston, VT (US); Anthony K. Stamper, Williston, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 79 days.

(21) Appl. No.: 14/563,097

(22) Filed: Dec. 8, 2014

(65) Prior Publication Data

US 2016/0163685 A1  Jun. 9, 2016

(51) Int. Cl.
| | | |
|---|---|---|
| *G06F 17/50* | (2006.01) | |
| *H01L 27/02* | (2006.01) | |
| *H01L 29/735* | (2006.01) | |
| *H01L 21/762* | (2006.01) | |
| *H01L 29/73* | (2006.01) | |
| *H01L 29/10* | (2006.01) | |
| *H01L 29/66* | (2006.01) | |
| *H01L 29/08* | (2006.01) | |
| *H01L 29/732* | (2006.01) | |

(52) U.S. Cl.
CPC ....... *H01L 27/0207* (2013.01); *G06F 17/5063* (2013.01); *H01L 21/76224* (2013.01); *H01L 29/73* (2013.01); *H01L 29/735* (2013.01); *G06F 17/5072* (2013.01); *H01L 29/0808* (2013.01); *H01L 29/1008* (2013.01); *H01L 29/6625* (2013.01); *H01L 29/7322* (2013.01)

(58) Field of Classification Search
CPC ........... H01L 29/0808; H01L 29/1008; H01L 29/6625; H01L 29/735; H01L 21/76224; H01L 29/7317; H01L 27/0623; H01L 29/73; H01L 29/7322; H01L 27/0207; G06F 17/5072; G06F 17/5063
See application file for complete search history.

(56) References Cited

U.S. PATENT DOCUMENTS

| | | | |
|---|---|---|---|
| 5,581,115 A | 12/1996 | Grubisich et al. | |
| 6,362,066 B1 * | 3/2002 | Ryum | H01L 29/66287 257/565 |
| 6,630,377 B1 * | 10/2003 | Panday | H01L 21/8249 257/E21.375 |

(Continued)

OTHER PUBLICATIONS

E. Canderle et al., "Impact of BEOL stress on BiCMOS9MW HBTs," IEEE Bipolar/BiCMOS Circuits and Technology Meeting, BCTM, 2013, pp. 223-226.

(Continued)

*Primary Examiner* — Helen Rossoshek
(74) *Attorney, Agent, or Firm* — Thompson Hine LLP; Anthony Canale

(57) ABSTRACT

Methods for designing and fabricating a bipolar junction transistor. A predetermined size for a device region of the bipolar junction transistor is determined based on a given current gain. A trench isolation layout is determined for a plurality of trench isolation regions to be formed in a substrate to surround the device region. The trench isolation regions are laterally spaced relative to each other in the trench isolation layout in order to set the predetermined size of the device region. An interconnect layout is determined that specifies one or more contacts coupled with a terminal of the bipolar junction transistor. The specification of the one or more contacts in the interconnect layout is unchanged by the determination of the trench isolation layout.

19 Claims, 9 Drawing Sheets

(56) References Cited

U.S. PATENT DOCUMENTS

| | | | |
|---|---|---|---|
| 7,439,608 B2* | 10/2008 | Arendt | H01L 29/0692 257/592 |
| 7,466,008 B2 | 12/2008 | Ko et al. | |
| 7,696,596 B2* | 4/2010 | Lim | H01L 27/14647 257/225 |
| 7,709,930 B2* | 5/2010 | Stricker | H01L 29/0821 257/197 |
| 7,741,186 B2 | 6/2010 | Chidambarrao et al. | |
| 7,785,974 B2* | 8/2010 | Hu | H01L 21/2253 257/E21.537 |
| 7,843,039 B2* | 11/2010 | Cooney, III | H01L 21/76224 257/593 |
| 7,855,104 B2* | 12/2010 | Voldman | H01L 21/8249 438/133 |
| 8,020,128 B2 | 9/2011 | Joseph et al. | |
| 8,299,578 B1* | 10/2012 | Babcock | H01L 29/0649 257/487 |
| 8,415,763 B2 | 4/2013 | Harame et al. | |
| 8,946,861 B2* | 2/2015 | Camillo-Castillo | H01L 29/1004 257/197 |
| 9,029,229 B2* | 5/2015 | Adkisson | H01L 29/737 438/312 |
| 2003/0222329 A1* | 12/2003 | Fresart | H01L 21/8249 257/565 |
| 2006/0170004 A1 | 8/2006 | Toyoda et al. | |
| 2008/0048222 A1* | 2/2008 | Lim | H01L 27/14603 257/292 |
| 2009/0152587 A1* | 6/2009 | Cerati | H01L 21/76237 257/147 |
| 2010/0213504 A1* | 8/2010 | Ko | H01L 21/8249 257/139 |
| 2010/0264427 A1* | 10/2010 | Veliadis | H01L 29/0619 257/77 |
| 2010/0301453 A1* | 12/2010 | Chung | H01L 27/0823 257/574 |
| 2011/0012129 A1* | 1/2011 | Zhang | H01L 21/8213 257/77 |
| 2012/0032303 A1* | 2/2012 | Elkareh | H01L 29/7322 257/587 |
| 2012/0168907 A1* | 7/2012 | Malladi | H01L 29/0821 257/565 |
| 2013/0020611 A1* | 1/2013 | Gumaelius | H01L 21/3065 257/183 |
| 2014/0034968 A1* | 2/2014 | Konstantinov | H01L 29/66068 257/77 |
| 2014/0239451 A1* | 8/2014 | Ito | H01L 29/735 257/565 |
| 2014/0246676 A1* | 9/2014 | Camillo-Castillo | H01L 29/66242 257/51 |
| 2015/0097265 A1* | 4/2015 | Lin | H01L 29/735 257/526 |

OTHER PUBLICATIONS

F. Yuan et al., "Mechanically strained Si-SiGe HBTs," IEEE Electron Device Letters, vol. 25, No. 7, 2004, pp. 483-485.

R. Malladi et al., "Geometry scaling issues originated by extrinsic stress in SiGe HBTs," IEEE Bipolar/BiCMOS Circuits and Technology Meeting, BCTM, 2008, pp. 145-148.

* cited by examiner

TUNABLE SCALING OF CURRENT GAIN IN BIPOLAR JUNCTION TRANSISTORS

BACKGROUND

The invention relates generally to integrated circuit fabrication and semiconductor devices and, in particular, to methods for designing and fabricating a bipolar junction transistor.

Bipolar junction transistors are found, among other end uses, in high-frequency and high-power end use applications. In particular, bipolar junction transistors may be used in microwave power amplifiers found in wireless communications systems and in power amplifiers found in mobile devices, as well as high-speed logic circuits. Bipolar junction transistors are three-terminal electronic devices that include semiconductor regions defining an emitter, a base, and a collector. An NPN bipolar junction transistor includes regions of n-type semiconductor material constituting the emitter and collector, and a region of p-type semiconductor material constituting the base situated between the regions of n-type semiconductor material. Similarly, a PNP bipolar junction transistor includes regions of p-type semiconductor material constituting the emitter and collector, and a region of n-type semiconductor material constituting the base situated between the regions of p-type semiconductor material. The emitter, base, and collector define a pair of junctions, namely a collector-base junction and an emitter-base junction, across which the conductivity type of the respective semiconductor materials changes. A voltage applied across the emitter-base junction produces charge flow between the collector and emitter.

Improved methods are needed for designing and fabricating bipolar junction transistors.

SUMMARY

In an embodiment of the invention, a method is provided that includes receiving a current gain for a bipolar junction transistor. A predetermined size is determined for a device region of the bipolar junction transistor based on the current gain. An interconnect layout that specifies one or more first contacts coupled with a terminal of the bipolar junction transistor is determined. A trench isolation layout, which includes a plurality of trench isolation regions to be formed in a substrate to surround the device region, is determined. The trench isolation regions are laterally spaced relative to each other in the trench isolation layout in order to set the predetermined size of the device region. The specification of the one or more contacts in the interconnect layout is unchanged by the determination of the trench isolation layout.

In another embodiment, a method is provided that includes receiving a layout that comprises an interconnect layout that specifies one or more contacts coupled with an emitter, a base, or a collector contact region of a bipolar junction transistor and a trench isolation layout for a plurality of trench isolation regions to be formed in a substrate to surround a device region used to form the bipolar junction transistor. The trench isolation regions are formed in the substrate consistent with the trench isolation layout to define the device region. The base is formed on the device region, the emitter is formed on the base, and the collector contact region, which is separated from the device region by the trench isolation regions, is formed. The one or more contacts and a wire, which is coupled by the one or more contacts with the emitter, the base, or the collector contact region, are formed. The device region includes a collector. The trench isolation regions are laterally spaced relative to each other in the trench isolation layout in order to set a predetermined size of the device region determined based on a current gain.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
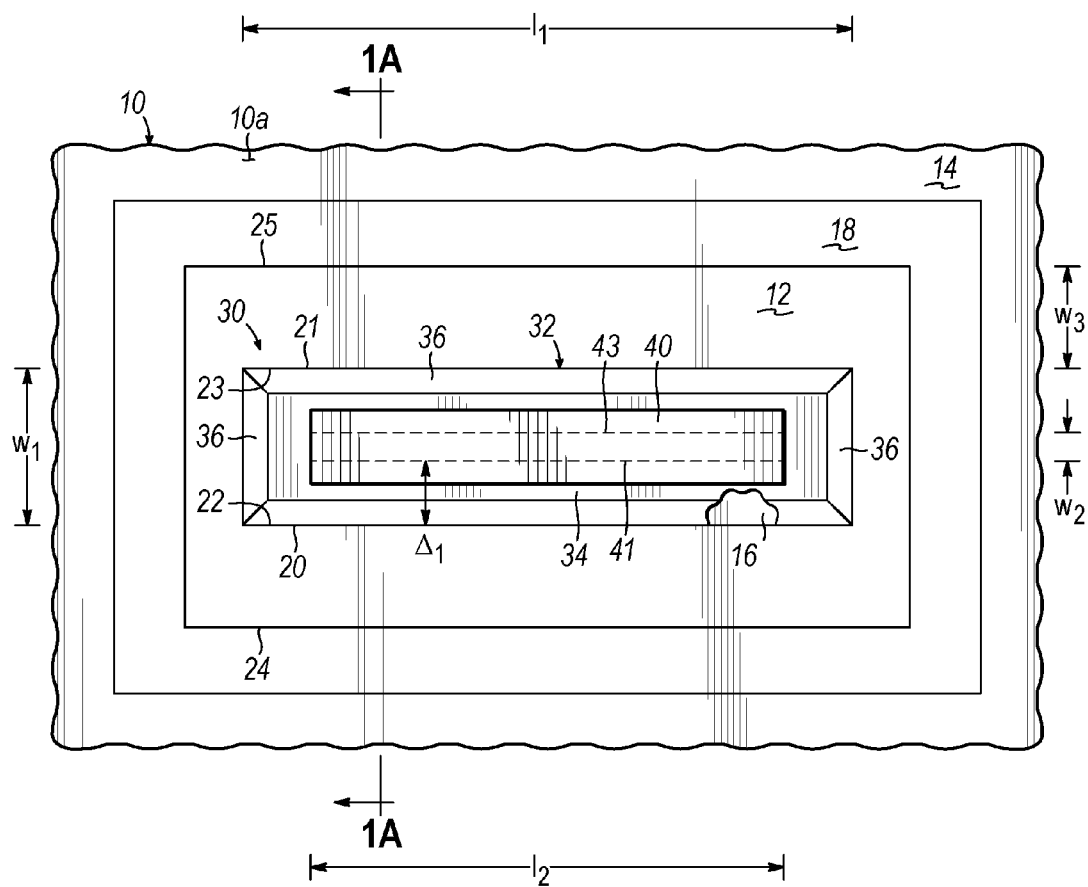
FIG. 1 is a top view of a bipolar junction transistor in accordance with an embodiment of the invention.
Figure 1A:
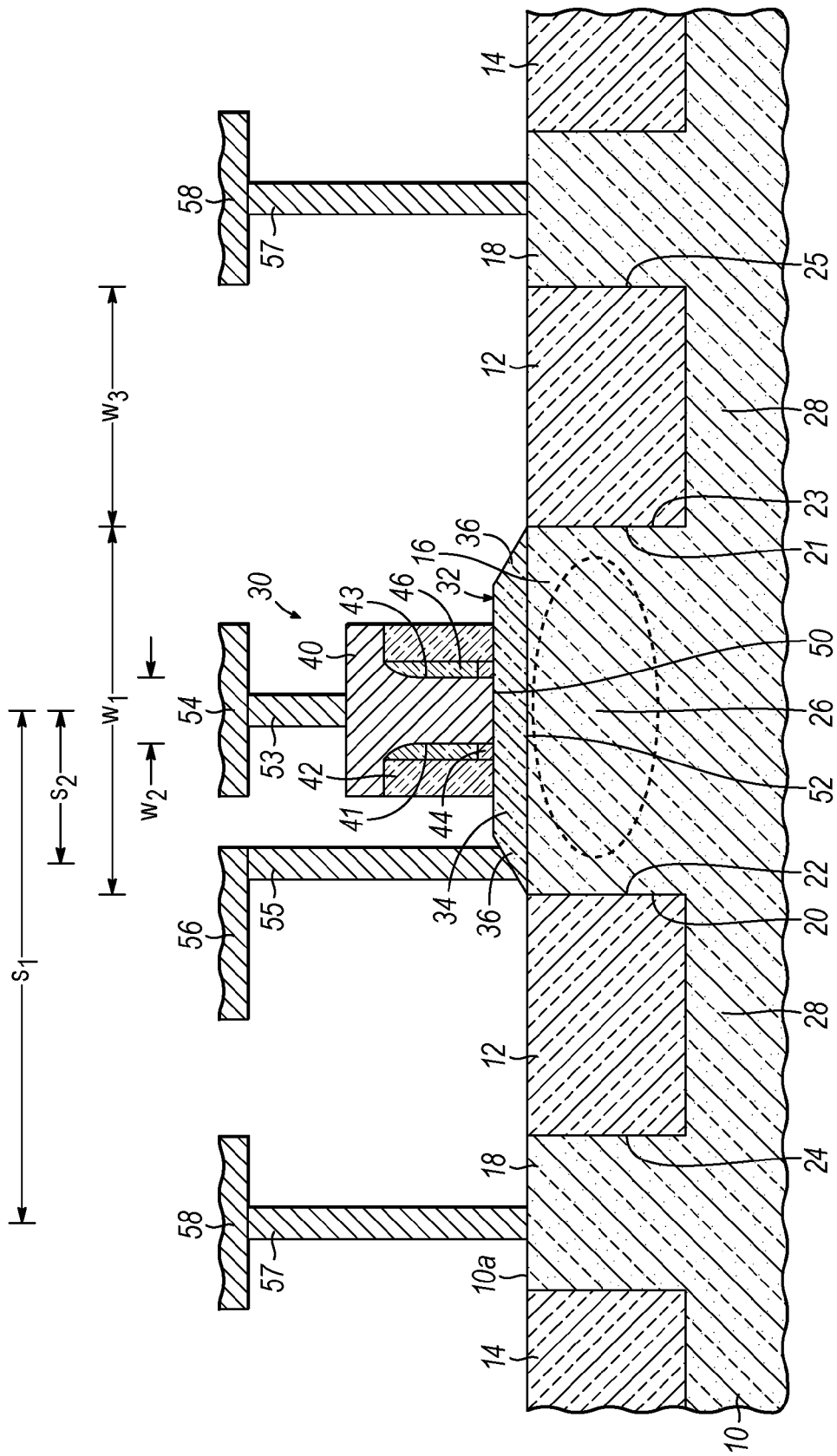
FIG. 1A is a cross-sectional view taken generally along line 1A-1A in FIG. 1, and in which the metallization of an interconnect structure for the bipolar junction transistor is added.

With reference to FIGS. 1, 1A and in accordance with an embodiment of the invention, a substrate 10 comprises a single-crystal semiconductor material operative for the formation of the devices of an integrated circuit. The semiconductor material constituting the substrate 10 may include an epitaxial layer at its surface, and the epitaxial layer may be doped with an electrically-active dopant to alter its electrical conductivity. For example, an epitaxial layer of single crystal silicon may be epitaxially deposited or grown the substrate 10 by chemical vapor deposition (CVD) and doped with an n-type dopant from Group V of the Periodic Table (e.g., phosphorus (P) or arsenic (As)) in a concentration effective to impart n-type conductivity.

The trench isolation regions 12, 14 are formed in the semiconductor material of the substrate 10. The trench isolation regions 12, 14 define the bounds of, and furnish electrical isolation for, a device region 16 and a collector contact region 18, which are each comprised of the semiconductor material of the substrate 10. The collector contact region 18 is positioned adjacent to the device region 16 and is separated from the device region 16 by the trench isolation regions 12. The trench isolation regions 14 include inner or interior sidewalls 22, 23 and exterior sidewalls 24, 25 in which interior sidewall 22 is adjacent to exterior sidewall 24 and interior sidewall 23 is adjacent to exterior sidewall 25. The trench isolation regions 12 have a width, $w_3$, measured in a lateral direction between the interior sidewall 22 and the exterior sidewall 24, and also between the interior sidewall 23 and the exterior sidewall 25.

The trench isolation regions 12 are arranged to surround the device region 16, and the trench isolation regions 14 are arranged to surround the collector contact region 18, the trench isolation regions 12, and the device region 16. The positions and arrangement of the trench isolation regions 12 define the size, geometrical shape, and outer perimeter of the device region 16. The positions and arrangement of the trench isolation regions 14 relative to the trench isolation regions 12 define the size, geometrical shape, inner perimeter, and outer perimeter of the collector contact region 18.

The trench isolation regions 12, 14 may be formed by a shallow trench isolation (STI) technique. To that end, a mask layer may be applied to a top surface of the substrate 10. The mask layer may comprise, for example, a photoresist that is applied with a spin coating process, pre-baked, exposed to a radiation projected through a photomask, baked after exposure, and developed with a chemical developer to define a pattern with openings coinciding with the intended positions of trenches for the trench isolation regions 12, 14. One or more etching processes may be used to define the trenches in the substrate 10 at positions consistent with the pattern of openings. Each etching process may comprise a wet chemical etch or a dry etch, and may rely on a given etch chemistry. The trenches, which extend to a given depth into the substrate 10, may be filled with an electrical insulator by depositing a layer of the electrical insulator to fill the trenches and then planarizing with, for example, chemical mechanical polishing (CMP) to remove excess the layer from the top surface of substrate 10. The trench isolation regions 12, 14 may be comprised of a dielectric material, such as an oxide of silicon (e.g., silicon dioxide ($SiO_2$)) deposited by CVD.

The device region 16 is characterized by a width, $w_1$, and a length, $l_1$, and includes outer or exterior sidewalls 20, 21. These dimensions for the device region 16 are established at an interface between the exterior sidewalls 20, 21 of the device region 16 and the interior sidewalls 22, 23 of the trench isolation region 12. The sidewall 20 of the device region 16 is positioned adjacent to sidewall 22 and the sidewalls 20, 22 are arranged in parallel planes. The sidewall 21 of the device region 16 is positioned adjacent to sidewall 23 and the sidewalls 21, 23 are arranged in parallel planes. The width, $w_1$, of the device region 16 at its outer perimeter is assessed as a distance between the sidewall 20 of the device region 16 and the sidewall 21 of the device region 16. Similarly, the length, $l_1$, of the device region 16 at its outer perimeter is assessed as a distance between an opposite pair of the sidewalls of the device region 16. The width, $w_1$, of the device region 16 and the length, $l_1$, of the device region 16 define lateral dimensions of the device region 16 and may be arranged to define a plane characterized by an area. The device region 16 also has a vertical dimension or height in a direction normal to this plane and established by the depth of penetration of the trench isolation regions 12 into the substrate 10 relative to the top surface.

The device region 16 of the bipolar junction transistor 30 may define a collector 26 of a bipolar junction transistor 30 or may include the collector 26. The collector 26 may constitute all or a portion of the device region 16, and may be comprised of the semiconductor material of the substrate 10. The electrical conductivity of the collector 26 may be elevated by, for example, an ion implantation of an electrically-active dopant. A subcollector 28 may extend laterally at depth in the substrate 10 that is beneath the trench isolation regions 12 in order to couple the collector 26 of the device region 16 with the collector contact region 18.

The remainder of the bipolar junction transistor 30 may then be constructed on the top surface of the device region 16. A base 32 is formed as a layer of a given thickness on the device region 16. The base 32 may include a single crystal section 34 positioned in vertical alignment with the device region 16 and that directly contacts the single crystal semiconductor material of the device region 16. The layer forming the base 32 may further include facets 36 that terminate at a position nominally coinciding with (i.e., coterminous with) the position of the edge of the device region 16 proximate to exterior sidewall 20 and that surround the single crystal section 34. Due to this conterminous relationship, the width and length of the base 32 is approximately equal to the width, $w_1$, and length, $l_1$, of the device region 16.

The base 32 may be comprised of a layer of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the base 32 may be uniform or the germanium content of base 32 may be graded and/or stepped across the thickness of base 32. If the germanium content is stepped, a partial thickness of the base 32, such as a thickness directly contacting the device region 16, may lack germanium and may instead be entirely comprised of silicon (Si) to provide an i-layer between the device region 16 and the base 32. The base 32 may be doped with a concentration of a dopant, such as an impurity species from Group III of the Periodic Table (e.g., boron or phosphorus) effective to impart p-type conductivity.

The base 32 may be formed using a low temperature epitaxial (LTE) growth process, such as vapor phase epitaxy (VPE) conducted at a growth temperature ranging from 400° C. to 850° C. Single crystal semiconductor material (e.g., single crystal silicon and/or single crystal SiGe) epitaxially grows in the single crystal section 34, which is disposed on the device region 16. The crystal structure of the single crystal semiconductor material of the device region 16 serves as a crystalline template for the growth of the crystal structure of the single crystal section 34 of the base 32. The facets 36 of the base 32 may comprise a mixture of polycrystalline and single crystal semiconductor material. The layer forming the base 32 may include a field region peripheral to the facets 36. The base 32 may be divided into an intrinsic base that participates in the emitter-base junction and an extrinsic base that is either formed on the layer defining the base 32 as a raised structure or formed in a portion of the layer defining the base 32.

An emitter 40 is located in an emitter opening that extends through a section of a dielectric layer 42 and a pad layer 44 beneath the dielectric layer 42. The emitter 40, which constitutes a single emitter finger, is electrically and physically coupled with a top surface of the base 32. The dielectric layer 42 and the pad layer 44 may be comprised of an electrical insulator, such as silicon nitride ($Si_3N_4$) or silicon dioxide ($SiO_2$) deposited using CVD. The dielectric layer 42 and pad layer 44 are patterned using photolithography and etching processes to define the emitter opening, which is aligned with the single crystal section 34 of the base 32. The base 32 is located vertically between the emitter 40 and the collector 26.

Non-conductive spacers 46 clad the emitter opening and are formed before the emitter 40 is formed. The spacers 46 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces. The emitter 40 includes exterior sidewalls 41, 43 that are adjacent to and coextensive with the spacers 46.

The emitter 40 may be formed from a layer of semiconductor material that is deposited and then itself patterned using lithography and etching processes. The emitter 40 may be comprised of a heavily-doped semiconductor material that is deposited and then patterned using lithography and etching processes. For example, the emitter 40 may be comprised of polysilicon or polycrystalline silicon-germanium deposited by CVD or LPCVD and heavily doped with a concentration of a dopant, such as an impurities species from Group V of the Periodic Table, such as phosphorus (P) or arsenic (As), effective to impart n-type conductivity. The lithography process may utilize photoresist and photolithography to form an etch mask that protects only a strip of the semiconductor material registered in position with the emitter opening. The dielectric layer 42 may also be lithographically patterned using one or more etch masks and etching processes, such as RIE, with a suitable etch chemistry. In addition, the patterning may unbury the collector contact region 18 by removing the overlying layer stack.

The bipolar junction transistor 30 features a vertical architecture in which the collector 26 in the device region 16, and the base 32 (i.e., the single crystal section 34), the emitter 40 are vertically arranged. The conductivity type of the semiconductor material constituting the base 32 is opposite to the conductivity type of the semiconductor materials constituting the emitter 40 and the collector 26. The bipolar junction transistor 30 may be characterized as a heterojunction bipolar transistor (HBT) if two or all three of the collector 26, the base 32, and the emitter 40 are comprised of different semiconductor materials. An emitter-base junction 50 is defined at the interface between the emitter 40 and the base 32. A base-collector junction 52 is defined at the interface between the collector 26 and the base 32.

The bipolar junction transistor 30 can be characterized by various performance metrics. One of those performance metrics is the common-emitter current gain or beta ($\beta$), which represents an amplification factor for the base current. The current gain may be determined based upon a ratio of the collector current (i.e., output current) to base current (i.e., input current).

During the front-end-of-line (FEOL) portion of the fabrication process, the device structure of the bipolar junction transistor 30 is replicated across at least a portion of the surface area of the substrate 10. In BiCMOS integrated circuits, complementary metal-oxide-semiconductor (CMOS) transistors may be formed using other regions of the substrate 10. As a result, both bipolar and CMOS transistors may be available on the same substrate 10.

Standard silicidation and standard middle-end-of-line (MEOL) and back-end-of-line (BEOL) processing follows, which includes formation of contacts and wiring for the local interconnect structure overlying the bipolar junction transistor 30, and formation of dielectric layers, via plugs, and wiring for an interconnect structure coupled by the interconnect wiring with the bipolar junction transistor 30, as well as other similar contacts for additional device structures like bipolar junction transistor 30 and CMOS transistors included in other circuitry fabricated on the substrate 10. Other active and passive circuit elements, such as diodes, resistors, capacitors, varactors, and inductors, may be integrated into the interconnect structure and available for use in the BiCMOS integrated circuit.

During middle-end-of-line (MEOL) processing, wires 54, 56, 58 and contacts 53, 55, 57 may be formed as parts of the local interconnect structure for the bipolar junction transistor 30 and in accordance with an interconnect layout. One or more contacts 53 are aligned with the emitter 40, one or more contacts 55 are aligned with a portion of the base 32 that is outside of the footprint of the emitter 40, and one or more contacts 57 are aligned with the collector contact region 14. Each set of one or more contacts 53, 55, 57 may comprise an array of vias (e.g., square vias) that are arranged with a given pitch. Alternatively, each set of one or more contacts 53, 55, 57 may comprise a bar via that may be larger than size than the vias of an array. The one or more contacts 53 couple the wire 54 with the emitter 40, the one or more contacts 55 couple the wire 56 with the portion of the base 32, and one or more contacts 57 couple the wire 58 with the collector contact region 14.

The wires 54, 56, 58 and contacts 53, 55, 57 are formed in a dielectric layer (not shown), which may be comprised of silicon dioxide ($SiO_2$), borophosphosilicate glass (BPSG), silicon nitride ($Si_3N_4$), fluorine-doped silicon glass (FSG), and combinations of these and other dielectric materials. The contacts 53, 55, 57 may be comprised of a conductive material, such as tungsten, deposited in openings defined in the dielectric layer by photolithography and etching processes. The wires 54, 56, 58 may be comprised of a conductive material, such as copper (Cu), and may be formed by a damascene process.

The bipolar junction transistor 30 can be divided into an intrinsic device region coinciding with the portions of the collector 26, the emitter 40, and the base 32 participating in the junctions 50, 52, and an extrinsic device region outside of the intrinsic device region. Within the intrinsic device region, the emitter 40 has a width, $w_2$, between its exterior sidewalls 41, 43 and a length, $l_2$, at its base that contacts the base 32 to define the junction 50. The width dimension of the emitter 40 is less than (i.e., shorter than) the length dimension of the emitter 40.

The lateral dimensions (width, $w_2$, and length, $l_2$) of the emitter 40 in the intrinsic device region are less than (i.e., smaller than) the lateral dimensions (width, $w_1$, and length, $l_1$) of the device region 16. The width, $w_1$, of the device region 16 and the width, $w_2$, of the emitter 40 differ by a dimension, $\Delta_1$. The dimension, $\Delta_1$, is equal to a distance between the interior sidewall 22 of the trench isolation region 12 and the exterior sidewall 41 of the emitter 40, and is also equal to a distance between the interior sidewall 23 of the trench isolation region 12 and the exterior sidewall 43 of the emitter 40. The width difference giving rise to dimension, $\Delta_1$, is measured in a lateral direction relative to the length, $l_2$, of the emitter 40.

Figure 2:
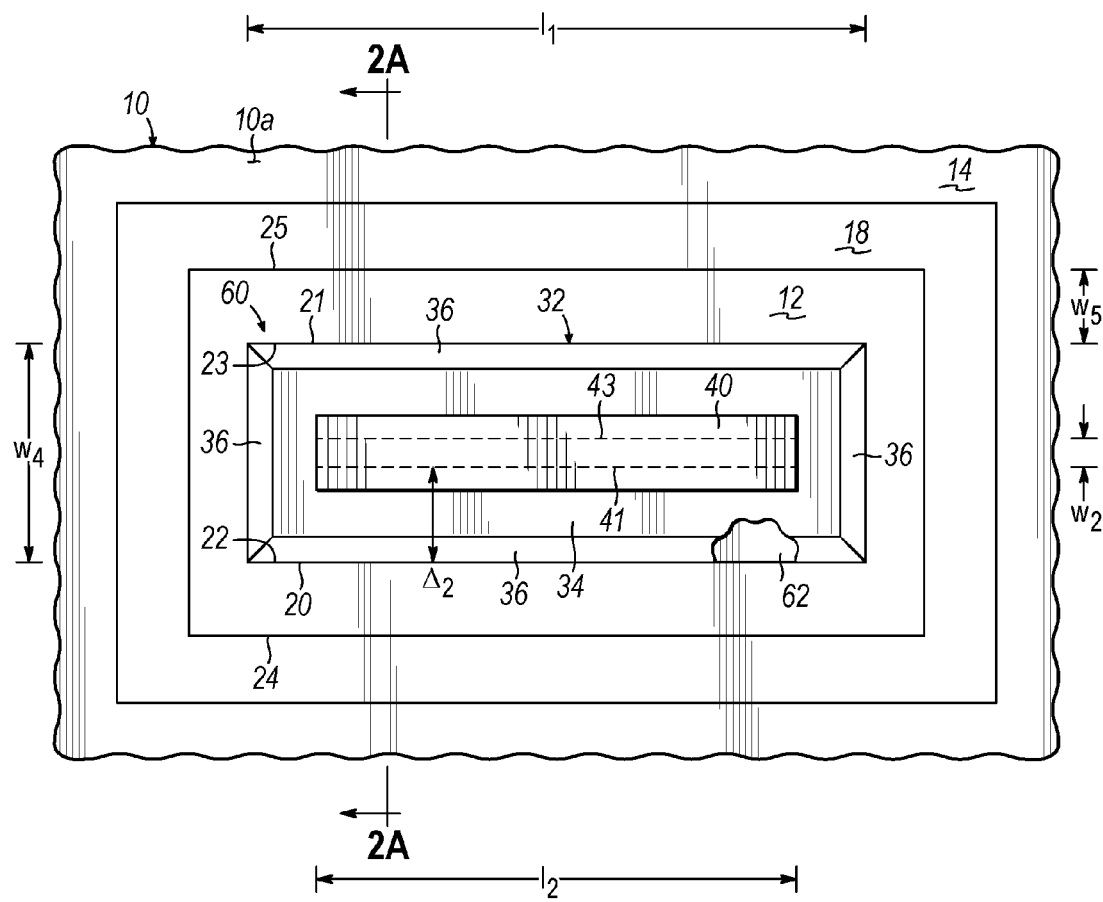
FIG. 2 is a top view of a bipolar junction transistor in accordance with an embodiment of the invention.
Figure 2A:
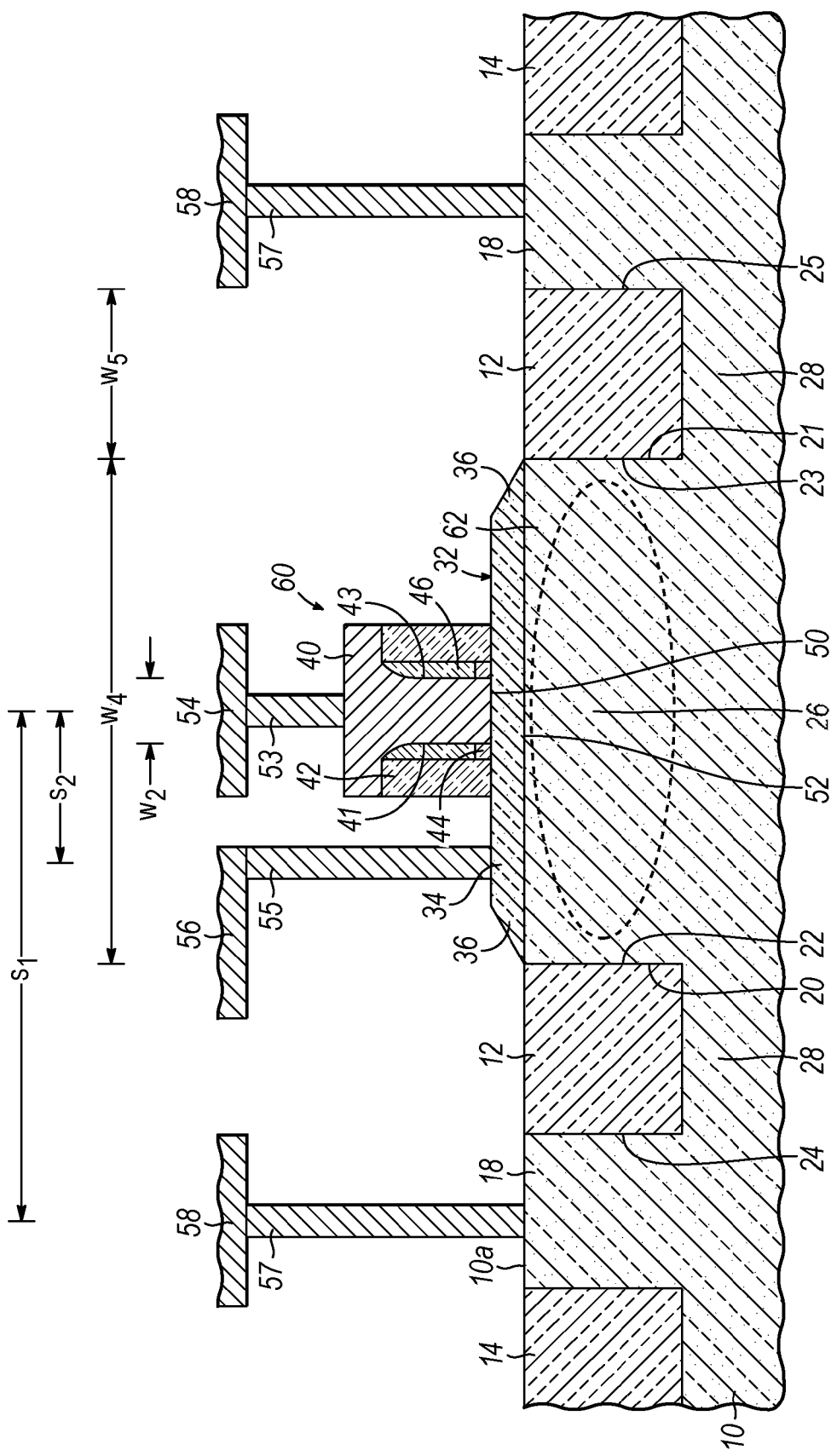
FIG. 2A is a cross-sectional view taken generally along line 2A-2A in FIG. 2, and in which the metallization of an interconnect structure for the bipolar junction transistor is added.

With reference to FIGS. 2, 2A in which like reference numerals refer to like features in FIGS. 1, 1A, the dimensions of the device region 16 can be changed without any other layout changes to the bipolar junction transistor 30, such as changing the dimensions of the emitter 40 in the intrinsic device region, to form a bipolar junction transistor 60. More specifically, a bipolar junction transistor 60, which is otherwise identical to the bipolar junction transistor 30, may include a device region 62 modified to have a width, $w_4$, that differs from the width, $w_1$, while maintaining the width, $w_2$, of the emitter 40 in the intrinsic device region unchanged. The width of the device region 62 may be modified, in comparison with the device region 16, by changing the position and/or the width of the trench isolation regions 12. More specifically, the position of the interior sidewalls 22, 23 of the trench isolation regions 12 may be changed such that, in the representative embodiment, the width, $w_4$, of device region 62 is greater than the width, $w_1$, of the device region 16. In the length dimension extending along the length, $l_2$, of the emitter 40, the position of the trench isolation regions 12 may remain unchanged so that the lengths, $l_1$, of the device regions 16, 62 are equal. The trench isolation regions 12 have a width, $w_5$, measured in a lateral direction between interior sidewall 22 and exterior sidewall 24, and also have the width, $w_5$, measured in a lateral direction between interior sidewall 23 and exterior sidewall 25.

The difference between the width, $w_2$, of the emitter 40 and the width, $w_4$, of the device region 62 is given by a dimension, $\Delta_2$. Dimension, $\Delta_2$, is equal to a distance between the interior sidewall 22 of the trench isolation region 12 and the exterior sidewall 41 of the emitter 40. The distance between the interior sidewall 23 of the trench isolation region 12 and the exterior sidewall 43 of the emitter 40 is also equal to the dimension, $\Delta 2$. In the representative embodiment, the width, $w_4$, of the device region 62 is greater than the width, $w_1$, of the emitter 40 to an extent that the dimension, $\Delta_2$, that is greater than the dimension, $\Delta_1$ (FIGS. 1, 1A) as the emitter width is constant for the different bipolar junction transistors 30, 60 and the variable is the relative dimensions of the device regions 16, 62. The width, $w_5$, of the trench isolation regions 12 used in conjunction with bipolar junction transistor 60 is less than the width, $w_3$, of the trench isolation regions 12 used in conjunction with bipolar junction transistor 60. However, the position of the exterior sidewalls 24, 25 of the trench isolation regions 12 does not change when the trench isolation region width changes and the device region size changes such that the position of the collector contact region 18 is unchanged.

Given a fixed emitter size, reducing the width of the trench isolation regions increases the value of the Δ dimension and increases the device region size, which may precipitate a decrease in the current gain. The adjustment to the current gain may result from changes in stress induced into the device region and the collector in the device region with scaling of the device region size. Devices with a more compact device region may experience higher stress due to the trench isolation regions than devices with a less compact device region.

The change in the width of the trench isolation regions 12, which precipitates a change in the Δ dimension and a change in the device region size, may be effective to cause the bipolar junction transistor 60 to have a different current gain (i.e. beta) than the bipolar junction transistor 30. This permits the current gain to be scaled among different bipolar junction transistors by merely changing the width of the trench isolation regions 12 and without otherwise disturbing the device layout. The scaling is tunable because the specific current gain for any given bipolar junction transistor can be selected through a selection of the device region size.

The bipolar junction transistors 30, 60 may have identical interconnect layout footprints, and the current gain of the bipolar junction transistor 60 may be adjusted without changing its interconnect layout footprint. For example, the wires 54, 56, 58 and contacts 53, 55, 57 for the different bipolar junction transistors 30, 60 have the same positions in their respective interconnect layouts. The adjustment in current gain results from a change in the size of the device region prompted by the change of width of the trench isolation regions 12, and may be produced without any other layout changes. As a result, the positions and dimensions of the collector contact region 18 and the emitter 40 may be the same in the different bipolar junction transistors 30, 60. Specifically, the positions and dimensions of the one or more contacts 53 and wire 54 for the emitter 40 may be the same in the interconnect layouts for the different bipolar junction transistors 30, 60, and the positions and dimensions of the one or more contacts 57 and wire 58 for the collector contact region 18 may be the same in the interconnect layouts for the different bipolar junction transistors 30, 60. While the dimensions of the base 32 may change with scaling of the device region size, the positions and dimensions of the one or more contacts 55 and wire 56 may be the same in the different bipolar junction transistors 30, 60. The spacings $s_1$, $s_2$ between the contacts 53, 55, 57 may be unchanged in the different bipolar junction transistors 30, 60 and as the current gain is tuned for bipolar junction transistor 60, and the spacings between the wires 54, 56, 58 in the different bipolar junction transistors 30, 60 may be unchanged and as the current gain is tuned for bipolar junction transistor 60.

Because the value of current gain for a given device can be selected without changing the layouts for contacts, wires, and vias in the adjacent metallization layers in the MEOL and BEOL interconnect structures, a designer may not have to change the circuit layout to integrate bipolar junction transistors with different current gains. In this regard, the layout of the bipolar junction transistor 30 may be used to generate a parameterized cell (PCell) with electronic design automation software based on the value of its layout parameters. The PCell may be geometrically scaled to provide different values for the current gain by merely changing the size of the device region as an input parameter without any other changes to the device layout. As a result, in a given circuit design, different instances of the same PCell may be generated that have different user-defined values of current gain.

Figure 3:
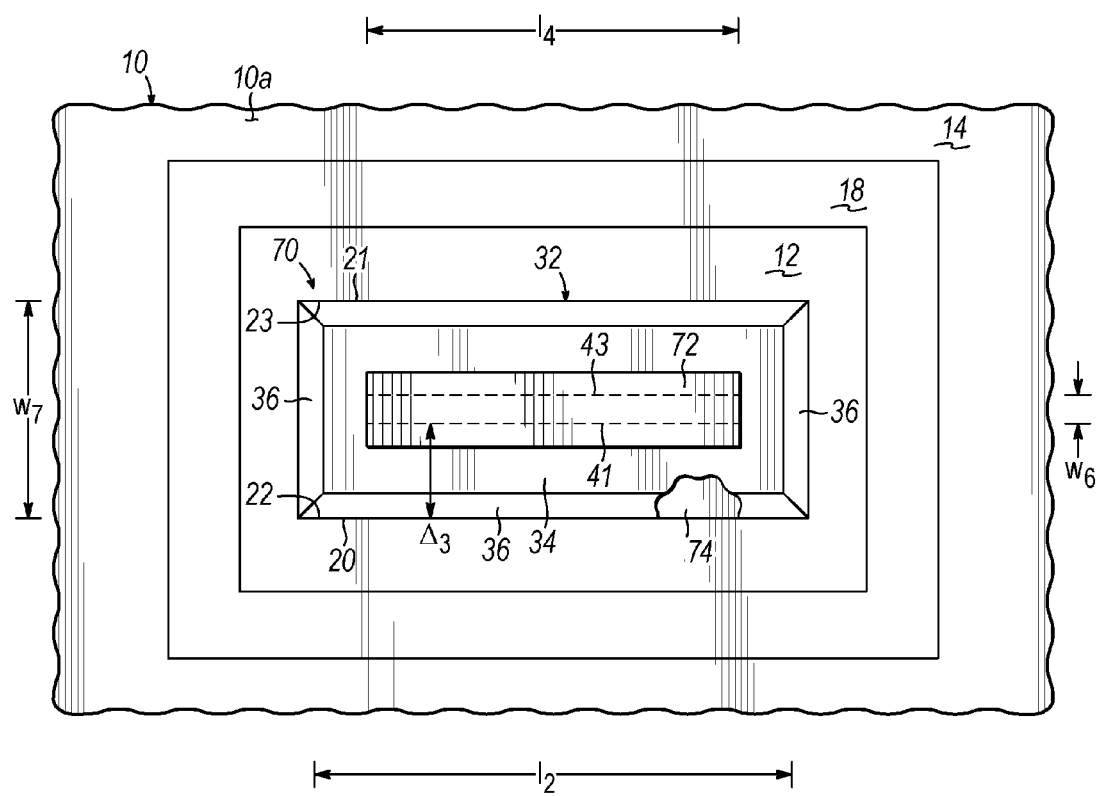
FIG. 3 is a top view similar to FIG. 1 of a bipolar junction transistor in accordance with an embodiment of the invention.

With reference to FIG. 3 in which like reference numerals refer to like features in FIGS. 1, 1A, a bipolar junction transistor 70 may be characterized by an emitter 72 that differs in length from the emitter 40 of bipolar junction transistor 30. More specifically, the emitter 72 may have a length, $l_4$, that is less than (i.e., shorter than) the length, $l_1$, of the emitter 40, and the width, $w_6$, of the emitter 72 may be identical to the width, $w_1$, of the emitter 40. If all other features in the layout of the bipolar junction transistors 30, 70 are identical, the dimensions of a device region 74 of the bipolar junction transistor 70 can be changed such that the bipolar junction transistor 30 and the bipolar junction transistor 70 have the same nominal value of current gain. More specifically, a width, $w_7$, of the device region 74 may be selected such that a difference between the width, $w_7$, and the width, $w_6$, of the emitter 72 is given by a dimension, $\Delta_3$, that is greater than the dimension, $\Delta_1$ (FIGS. 1, 1A). The increased dimension, $\Delta_3$, may have the effect of reducing the value of current gain for the bipolar junction transistor 70 and thereby compensate for an increase in the value of current gain produced by the shortening of the length, $l_4$, of the emitter 72 in comparison with the length, $l_1$, of the emitter 40. As a result, the value of current gain for the different bipolar junction transistors 30, 70 may be made nominally identical through selection of layout parameters at the trench isolation layout.

The current gain for the bipolar junction transistor 70 may be adjusted without changing the device footprint with respect to metal contacts and wiring. The wires 54, 56, 58 and contacts 53, 55, 57 have the same positions within the interconnect layout independent of the current gain that is selected through the selection of the width of the trench isolation regions and the device region size. The different current gains may be scaled and tuned without any other device layout changes. For example, in the interconnect layout, the spacings $s_1$, $s_2$ between the contacts 53, 55, 57 and the spacings between the wires 54, 56, 58 may be kept constant as the current gain is varied in the device design of the bipolar junction transistor 70.

Figure 4:
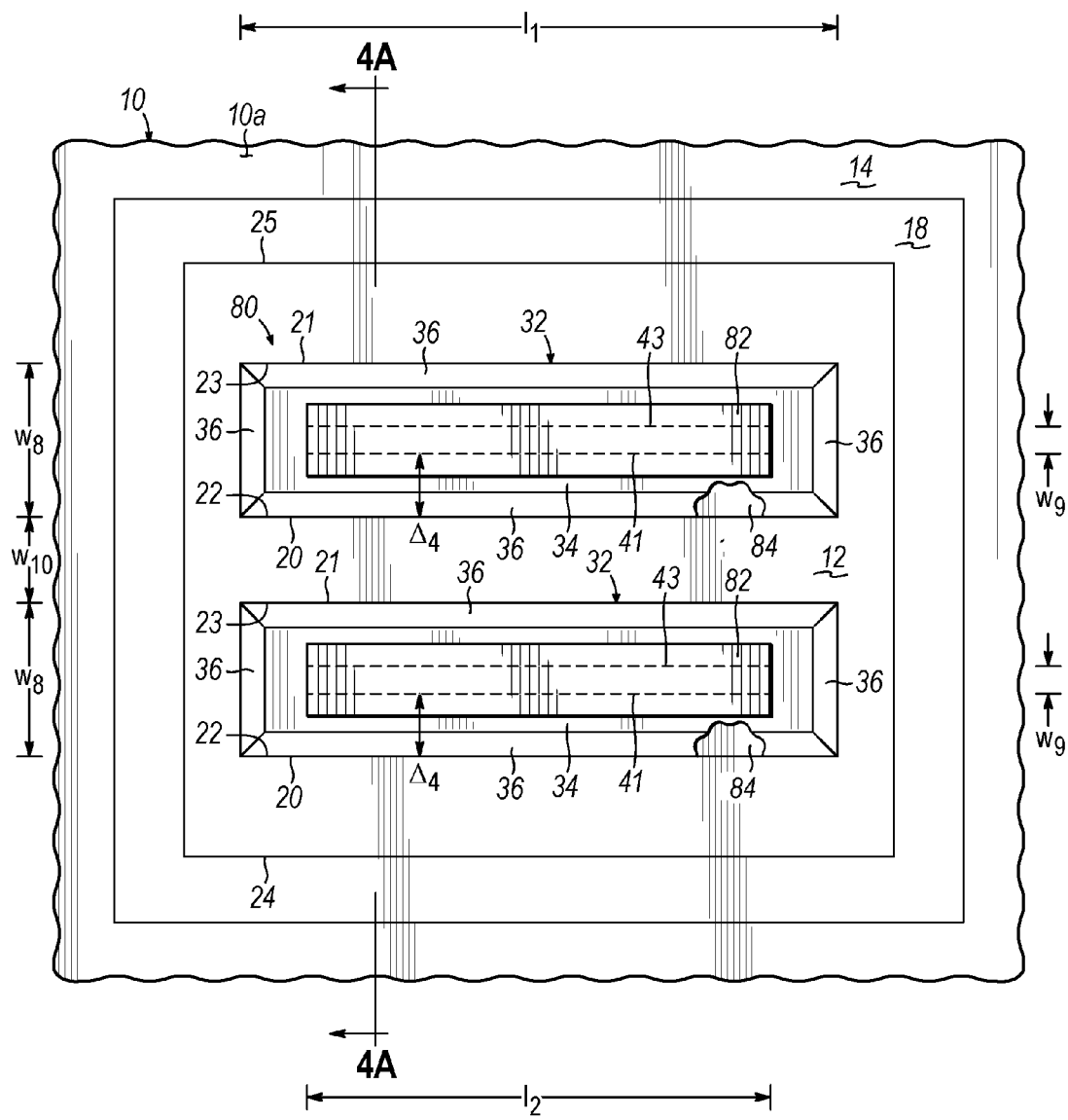
FIG. 4 is a top view of a bipolar junction transistor in accordance with an embodiment of the invention.
Figure 4A:
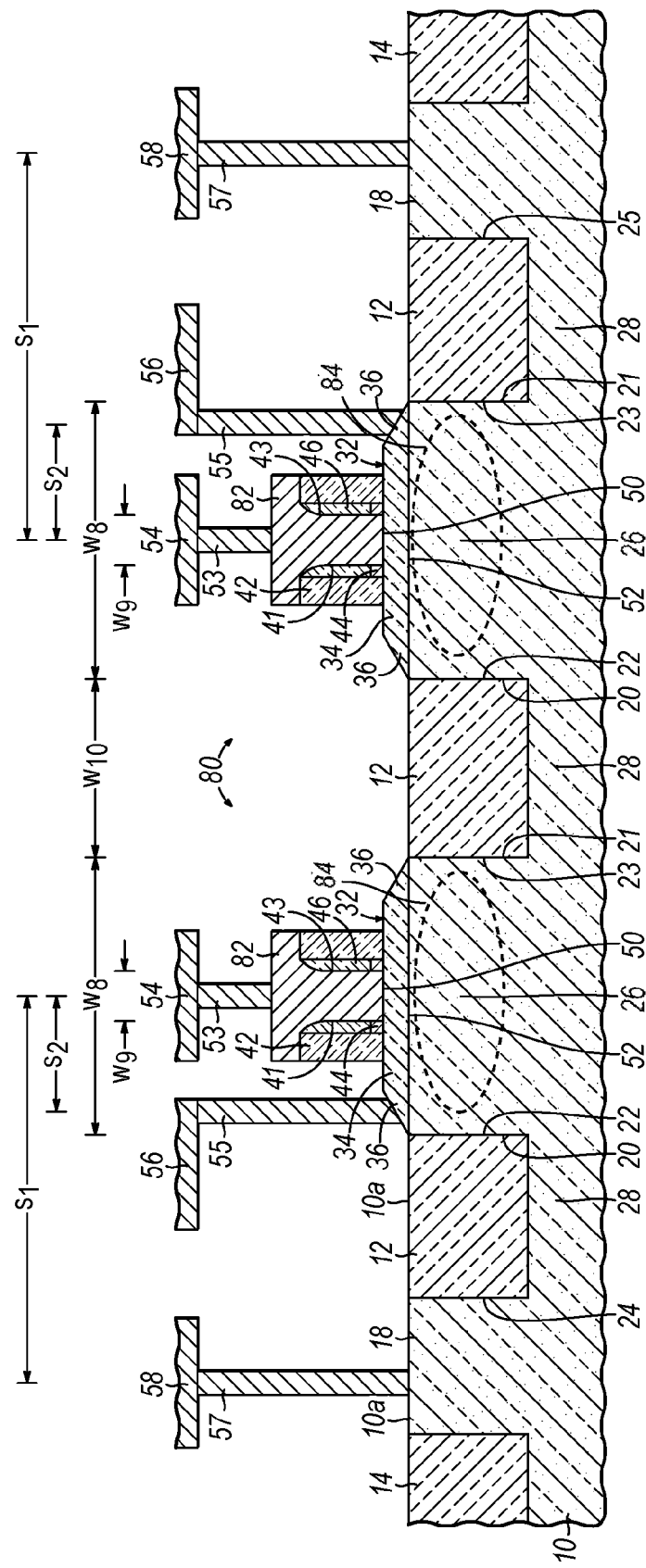
FIG. 4A is a cross-sectional view taken generally along line 4A-4A in FIG. 4.

With reference to FIGS. 4, 4A in which like reference numerals refer to like features in FIGS. 2, 2A, a bipolar junction transistor 80 may be characterized by multiple emitter fingers 82 in comparison with the single-finger emitter 40 of the bipolar junction transistor 60 (FIGS. 2, 2A). The number of emitter fingers 82 may vary according to the device design. The value of current gain for the different bipolar junction transistor 80 may be adjusted by adjusting the dimensions of the device region 84 associated with each emitter finger 82. In particular, a width, $w_8$, of the device region 84 may be selected such that a difference between the width, $w_8$, and a width, $w_9$, of the associated emitter finger 82 is given by a dimension, $\Delta_4$.

The trench isolation regions 12 have a width, $w_{10}$, measured in a lateral direction between adjacent pairs of sidewalls 22, 23, 24, 25 of the trench isolation regions 12. As a result, trench isolation regions 12 have a width, $w_{10}$, between adjacent device regions 84, and also have a width, $w_{10}$, between the device regions 84 and the collector contact region 18.

The change in the width, $w_{10}$, of the trench isolation regions 12, which precipitates a change in the $\Delta$ dimension and a change in the device region size, may be effective to adjust the current gain (i.e., beta) of the bipolar junction transistor 80 so as to tune the current gain. The tuning may cause the bipolar junction transistor 80 to have a different current gain than another bipolar junction transistor of in the integrated circuit or, alternatively, may cause the bipolar junction transistor 80 to have the same current gain as another bipolar junction transistor in the integrated circuit. As a result, the value of current gain for the bipolar junction transistors with different numbers of emitter fingers may be made nominally equal through selection of trench isolation layout parameters. For example, the tuning may cause the bipolar junction transistor 80 to have the same current gain as a bipolar junction transistor characterized by an emitter having larger number of emitter fingers or the same current gain as a bipolar junction transistor characterized by an emitter having a single emitter finger. The tuning may also be used to scale the current gain of a device having the same number of emitter fingers with the same characterizing parameters.

The adjustment to the current gain is accomplished without changing the footprint of the interconnect layout. Specifically, the positions of the wires 54, 56, 58 and contacts 53, 55, 57 do not change as the device region size is varied by a width change of the trench isolation regions 12 in order to adjust the current gain. As a result, the pitch determined by spacings $s_1$, $s_2$ between the contacts 53, 55, 57 and the spacings between the wires 54, 56, 58 by unchanged as the process that tunes and scales the current gain by predetermining the size of each device region 84.

Figure 5:
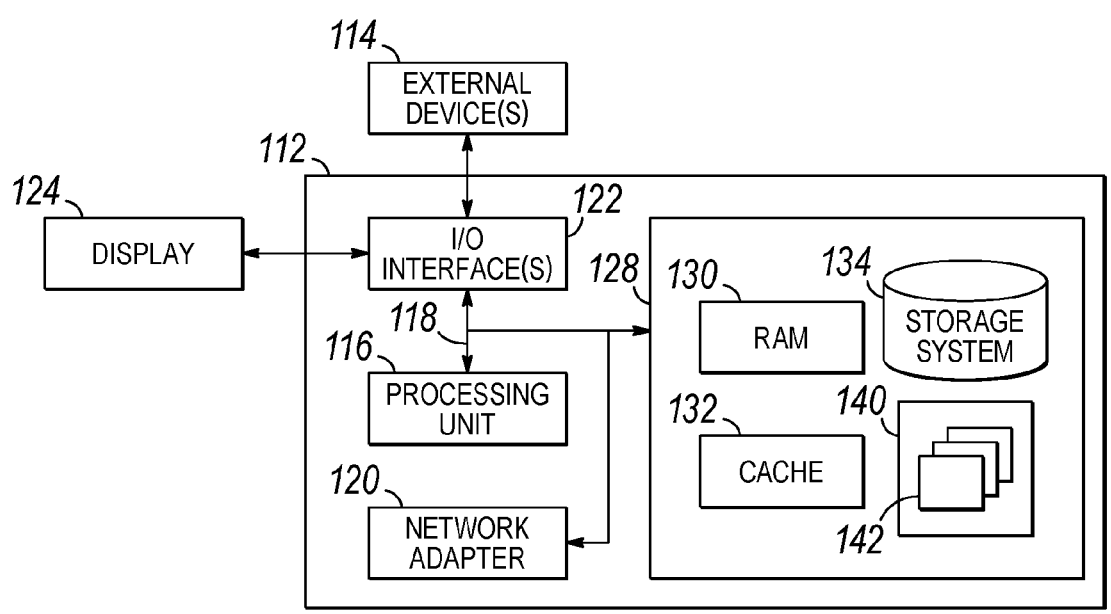
FIG. 5 is a diagrammatic view of an exemplary computer system configured to determine a trench isolation layout for a bipolar junction transistor that determines a device region size to match a desired current gain.

Referring now to FIG. 5, a schematic of an exemplary computer system 112 is shown. The computer system 112 may include one or more processors or processing units 116, a system memory 128, and a bus 118 that couples various system components including system memory 128 to each processing unit 116. Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system 112 typically includes a variety of computer system readable media. Such media may be any available media that is accessible by computer system 112, and it includes both volatile and non-volatile media, removable and non-removable media.

System memory 128 can include computer system readable media in the form of volatile memory, such as random access memory (RAM) 130 and/or cache memory 132. Computer system 112 may further include other removable/non-removable, volatile/non-volatile computer system storage media. By way of example only, storage system 134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM, or other optical media can be provided. In such instances, each can be connected to bus 118 by one or more data media interfaces. As will be further depicted and described below, system memory 128 may include at least one program product having a set (e.g., at least one) of program modules that are configured to carry out the functions of embodiments of the invention.

Program/utility 140, having a set (at least one) of program modules 142, may be stored in system memory 128 by way of example, and not limitation, as well as an operating system, one or more application programs, other program modules, and program data. Each of the operating system, one or more application programs, other program modules, and program data or some combination thereof, may include an implementation of a networking environment. Program modules 142 generally carry out the functions and/or methodologies of embodiments of the invention as described herein.

Computer system 112 may also communicate with one or more external devices 114 such as a keyboard, a pointing device, a display 124, etc.; one or more devices that enable a user to interact with computer system 112; and/or any devices (e.g., network card, modem, etc.) that enable computer system 112 to communicate with one or more other computing devices. Such communication can occur via Input/Output (I/O) interfaces 122. Still yet, computer system 112 can communicate with one or more networks such as a local area network (LAN), a general wide area network (WAN), and/or a public network (e.g., the Internet) via network adapter 120. As depicted, network adapter 120 communicates with the other components of computer system 112 via bus 118. It should be understood that although not shown, other hardware and/or software components could be used in conjunction with computer system 112. Examples, include, but are not limited to: microcode, device drivers, redundant processing units, external disk drive arrays, RAID systems, tape drives, and data archival storage systems, etc.

Figure 6:
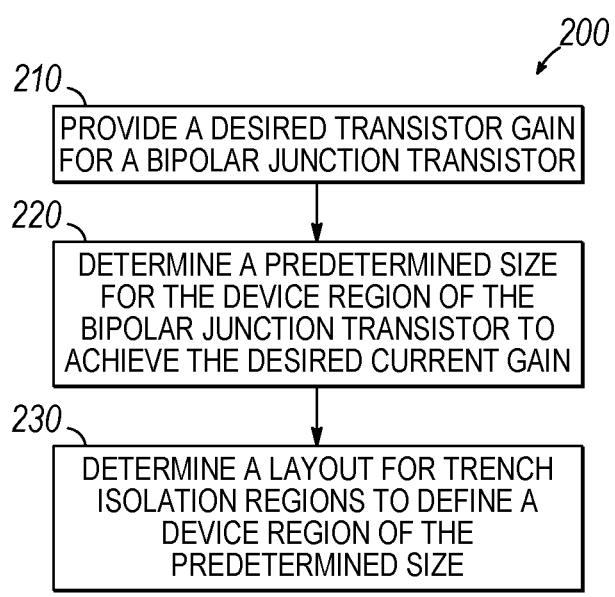
FIG. 6 is a flow chart detailing a method of predetermining a device region size to provide a desired current gain for a bipolar junction transistor in accordance with an embodiment of the invention.

FIG. 6 provides a flowchart 200 that illustrates a sequence of operations that may be performed by the computer system 112 to design bipolar junction transistors consistent with the embodiments of the invention.

In block 210, parameters characterizing a bipolar junction transistor are received at the computer system 112. In particular, the computer system 112 may receive a desired current gain given by a ratio between collector and base currents (i.e., beta=collector current (Ic)/base current (Ib) under specified DC voltage bias conditions) and other characteristics of the bipolar junction transistor, such as other parameters relating to the layout of the bipolar junction transistor. The current gain is a figure of merit for a bipolar junction transistor and reflects that, during operation, the current flowing through the emitter and collector of the bipolar junction transistor is numerically greater than the current flowing through the base terminal. A typical current gain for a bipolar junction transistor may range from 10 to 1000.

In block 220, a determination is made to predetermine a size (i.e., dimensions such as the length and width) for a device region of the bipolar junction transistor based on the given current gain and the current density requirements. To that end, the computer system 112 may compute a predetermined size for the device region that is effective to establish the given current gain, while other parameters that could impact the value of the current gain are held constant. For example, the parameters characterizing the emitter may be held constant. The device region size is predetermined prior to the fabrication of the bipolar junction transistor. Alternatively, the computer system 112 may be determine the predetermined size of the device region from a memory-stored look-up table correlating device region size with current gain and optionally other device characteristics.

In block 230, the computer system 112 may determine a trench isolation layout for the bipolar junction transistor. The trench isolation layout may specify an arrangement and positions for the trench isolation regions formed in the substrate. The trench isolation layout may include a position of an inner sidewall, a width of the trench isolation regions, and a trench depth to define a collector contact region using to contact the collector and a device region in which the collector is located. The trench isolation layout may contain information about the trench pattern to be made in the substrate, wherein the trench pattern is used to create a photomask that is used in a photolithographic processing step to form the trenches for the trench isolation regions.

The device region size may be established by determining a position for interior sidewall of the trench isolation regions in the trench isolation layout. The predetermined size of the device region is measured in a lateral direction between the trench isolation regions and, more specifically, between interior sidewalls of the trench isolation regions. The interior sidewalls of the trench isolation regions are coextensive with the device region, and are laterally spaced relative to each other in the trench isolation layout in order to set the predetermined size of the device region. The exterior sidewalls of the trench isolation regions are coextensive with the collector contact region, and may be held fixed in position so that the width of the trench isolation regions changes without altering the collector contact region.

For purposes of the computation to determine the trench isolation layout, the bipolar junction transistor may be modeled with a device model that receives the layout parameters as input, and the device model may be a module for circuit simulation software executing on the computer system 112. During the computation, the computer system 112 is permitted to adjust the trench isolation layout to provide the desired current gain by changing the position of the interior sidewalls of the trench isolation regions and thereby change the size (e.g., length and width) of the device region and/or collector that is bounded by the trench isolation regions.

The computer system 112 may also receive parameters used to determine a base layout, an emitter layout, and a interconnect layout for contacts, wires, and vias servicing the bipolar junction transistor. The emitter layout may be determined from specified parameters such as the length and width of the emitter, as well as the number of emitter fingers. The interconnect layout may be determined from specified parameters such as the positions and arrangement of the wires, vias, and contacts servicing the emitter, the collector, and the base. Generally, the interconnect layout specifies one or more contacts and a wire that is coupled by the one or more contacts with each terminal of the bipolar junction transistor. The interconnect layout specifies one or more contacts and a wire that is coupled by the one or more contacts with the emitter, one or more contacts and a wire that is coupled by the one or more contacts with the collector contact region that itself is coupled with the collector, and one or more contacts and a wire that is coupled by the one or more contacts with the base.

The computer system 112 may determine the interconnect layout and, in one embodiment, may determine the interconnect layout prior to the determination of the trench isolation layout. The interconnect layout may be unchanged by the determination of the trench isolation layout. Specifically, the positions and arrangement of one or more contacts and one or more wires in the interconnect layout may be invariant when the predetermined size for the device region is computed. In this manner, a device design may be scaled to provide different current gains by exclusively changing the dimensions of the device region. For example, the positions and arrangement of the wire and one or more contacts specified in the local interconnect level of the interconnect layout for the collector contact region may not be changed after the determination of the trench isolation layout. To that end, the exterior sidewall of the trench isolation regions, which is coextensive with the collector contact region, may remain fixed during the computation so that the positions and arrangement of the one or more contacts and the wire coupled by the one or more contacts with the collector contact region are unchanged. As another example, the positions and arrangement of the wire and one or more contacts specified in the local interconnect level of the interconnect layout for the collector contact region may not be changed after the determination of the trench isolation layout. The one or more contacts coupled with the emitter and the one or more contacts coupled with the collector contact region may be spaced in the interconnect layout by a spacing, and the spacing may be unchanged by the determination of the trench isolation layout.

Another bipolar junction transistor with a different current gain may be included in the same circuit design as the initial bipolar junction transistor. Based on the design of the initial bipolar junction transistor, the computer system 112 may be operated to determine a device region size for this additional bipolar junction transistor so as to provide the corresponding given current gain by adjusting only the device region size using the sequence of operations in flowchart 200. In an embodiment, the current gains of the bipolar junction transistors may be different, and the predetermined device regions sizes may also be different. However, the interconnect layout of this bipolar junction transistor may be constrained to remain unchanged from the interconnect layout of the initial bipolar junction transistor. For example, the positions and arrangement of the wire and contacts included in the local interconnect level of the interconnect layout for the collector contact region of the initial bipolar junction transistor may be identical to the positions and arrangement of the wire and contacts included in the local interconnect level of the interconnect layout for the collector contact region of each additional bipolar junction transistor. As another example, the positions and arrangement of the wire and contacts included in the local interconnect level of the interconnect layout for the emitter of the initial bipolar junction transistor may be identical to the positions and arrangement of the wire and contacts included in the local interconnect level of the interconnect layout for the emitter of each additional bipolar junction transistor. The specification of the contacts and wires in the interconnect layout may be unchanged by the determination of the trench isolation layout.

The methods as described above may be used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    receiving, at one or more processors, a first current gain for a first bipolar junction transistor;
    determining, by the one or more processors, a first predetermined size for a first device region of the first bipolar junction transistor based on the first current gain;
    determining, by the one or more processors, a first interconnect layout that specifies one or more first contacts coupled with a first emitter of the first bipolar junction transistor; and
    determining, by the one or more processors, a first trench isolation layout for a plurality of first trench isolation regions to be formed in a substrate to surround the first device region;
    creating a photomask based on the first trench isolation layout that is used to form the first trench isolation regions during fabrication of the first bipolar junction transistor;
    receiving, at the one or more processors, a second current gain for a second bipolar junction transistor;
    determining, by the one or more processors, a second predetermined size for a second device region of the second bipolar junction transistor based on the second current gain; and
    determining, by the one or more processors, a second trench isolation layout for a plurality of second trench isolation regions to be formed in the substrate to surround the second device region,
    wherein the first trench isolation regions are laterally spaced relative to each other in the first trench isolation layout in order to set the first predetermined size of the first device region, the second trench isolation regions are laterally spaced relative to each other in the second trench isolation layout in order to set the second predetermined size of the second device region, the second bipolar junction transistor includes a second emitter, the first bipolar junction transistor has a first dimension between an interior sidewall of the first trench isolation regions and an exterior sidewall of the first emitter, the second bipolar junction transistor has a second dimension between an interior sidewall of the second trench isolation regions and an exterior sidewall of the second emitter, the second dimension is greater than the first dimension, and the specification of the one or more first contacts in the first interconnect layout is unchanged by the determination of the first trench isolation layout.

2. The method of claim 1 wherein the first interconnect layout specifies a first wire that is coupled by the one or more first contacts with the first terminal, and the specification of the first wire in the first interconnect layout is unchanged by the determination of the first trench isolation layout.

3. The method of claim 1 wherein the first bipolar junction transistor includes a collector contact region defined in the substrate by determination of the first trench isolation layout, the first interconnect layout includes one or more second contacts that are coupled with the collector contact region, and the specification of the one or more second contacts in the first interconnect layout is unchanged by the determination of the first trench isolation layout.

4. The method of claim 3 wherein the one or more first contacts are spaced from the one or more second contacts in the first interconnect layout by a spacing, and the spacing is unchanged by the determination of the first trench isolation layout.

5. The method of claim 3 wherein the first interconnect layout specifies a first wire that is coupled by the one or more first contacts with the first terminal and a second wire that is coupled by the one or more first contacts with the collector contact region, and the specification of the first wire and the second wire in the first interconnect layout is unchanged by the determination of the first trench isolation layout.

6. The method of claim 1 wherein the one or more first contacts have respective positions that are is unchanged by the determination of the first trench isolation layout.

7. The method of claim 1 wherein the one or more first contacts have an arrangement that is unchanged by the determination of the first trench isolation layout.

8. The method of claim 1 wherein the second current gain is not equal to the first current gain, and the first predetermined size for the first device region is not equal to the second predetermined size for the second device region.

9. The method of claim 1 wherein the first terminal of the first bipolar junction transistor is a first emitter, the second bipolar junction transistor includes a second emitter, and further comprising:
  determining, by the one or more processors, a second interconnect layout that specifies one or more second contacts coupled with the second emitter,
  wherein the second interconnect layout and the first interconnect layout are equal.

10. The method of claim 1 wherein the first emitter and the second emitter have different lengths.

11. The method of claim 1 wherein determining, by the one or more processors, the first trench isolation layout for the first trench isolation regions to be formed in the substrate to surround the first device region comprises:
  determining a width of the first trench isolation regions.

12. The method of claim 11 wherein the first terminal is an emitter having a length, and the width of the first trench isolation regions is measured relative to the length of the emitter.

13. The method of claim 11 wherein the first terminal includes a first emitter finger and a second emitter finger, the first emitter finger is associated with the first device region, the second emitter finger is associated with a second device region having the first predetermined size of the first device region, and the width of the first trench isolation regions is measured between the first device region and the second device region.

14. The method of claim 13 wherein the one or more first contacts comprise a first set of the first contacts and a second set of the first contacts, the first set of the first contacts is coupled with the first emitter finger, the second set of the first contacts is coupled with the second emitter finger, and the specification of the first set of the first contacts and the second set of the first contacts in the first interconnect layout included a pitch that is unchanged by the determination of the first trench isolation layout.

15. The method of claim 11 wherein the first bipolar junction transistor includes a collector contact region defined in the substrate by determination of the first trench isolation layout, the first terminal includes a first emitter finger and a second emitter finger, the first emitter finger is associated with the first device region, and the width of the first trench isolation regions is measured between the first device region and the collector contact region.

16. The method of claim 1 wherein determining, by the one or more processors, the first trench isolation layout for the first trench isolation regions to be formed in the substrate to surround the first device region comprises:
  positioning, by the one or more processors, a plurality of interior sidewalls of the first trench isolation regions in the first trench isolation layout to set the first predetermined size for the first device region.

17. The method of claim 16 wherein the first trench isolation regions include a plurality of exterior sidewalls that are coextensive with a collector contact region, the collector contact region is separated from the first device region by the first trench isolation regions, and the exterior sidewalls of the first trench isolation regions have respective positions that are unchanged by the determination of the first predetermined size for the first device region.

18. The method of claim 17 wherein the first trench isolation layout includes a plurality of second trench isolation regions to be formed in the substrate, and the collector contact region is defined between the first trench isolation regions and the second trench isolation regions.

19. The method of claim 1 further comprising:
  applying a mask layer to the substrate;
  patterning the mask layer using the photomask to corresponding to the first trench isolation layout;
  etching the substrate, with the mask layer present, to form a plurality of trenches in the substrate that define the first device region;
  depositing a layer of an electrical insulator to fill the trenches and form the first trench isolation regions; and
  forming the one or more contacts based upon with first interconnect layout.

* * * * *

UNITED STATES PATENT AND TRADEMARK OFFICE
CERTIFICATE OF CORRECTION

PATENT NO. : 9,496,250 B2
APPLICATION NO. : 14/563097
DATED : November 15, 2016
INVENTOR(S) : Vibhor Jain et al.

Page 1 of 1

It is certified that error appears in the above-identified patent and that said Letters Patent is hereby corrected as shown below:

In the Claims

At Column 16, Claim number 19, Line number 35, after "photomask", delete "to" and at Line 42, change "with" to --the--

Signed and Sealed this
Tenth Day of January, 2017

Michelle K. Lee
*Director of the United States Patent and Trademark Office*